United States Patent
Yoon et al.

(10) Patent No.: US 8,803,001 B2
(45) Date of Patent: Aug. 12, 2014

(54) BONDING AREA DESIGN FOR TRANSIENT LIQUID PHASE BONDING PROCESS

(75) Inventors: Sang Won Yoon, Ann Arbor, MI (US); Satoshi Yasuda, Aichi (JP); Koji Shiozaki, Ann Arbor, MI (US)

(73) Assignee: Toyota Motor Engineering & Manufacturing North America, Inc., Erlanger, KY (US)

( * ) Notice: Subject to any disclaimer, the term of this patent is extended or adjusted under 35 U.S.C. 154(b) by 241 days.

(21) Appl. No.: 13/165,660

(22) Filed: Jun. 21, 2011

(65) Prior Publication Data

US 2012/0325539 A1  Dec. 27, 2012

(51) Int. Cl.
*H05K 1/18* (2006.01)
*B05D 1/36* (2006.01)
*B23K 35/02* (2006.01)
*B05D 5/00* (2006.01)

(52) U.S. Cl.
USPC ............ 174/261; 427/256; 428/576; 174/259

(58) Field of Classification Search
CPC .............. H05K 1/18; B05D 1/36; B05D 5/00; B23K 35/02
USPC ..................... 174/261, 259; 427/256; 428/576
See application file for complete search history.

(56) References Cited

U.S. PATENT DOCUMENTS

| | | | |
|---|---|---|---|
| 4,551,904 A | 11/1985 | Berenz et al. | |
| 5,113,145 A | 5/1992 | Ideler et al. | |
| 5,152,695 A | 10/1992 | Grabbe et al. | |
| 5,166,774 A | 11/1992 | Banerji et al. | |
| 5,225,633 A | 7/1993 | Wigginton | |
| 5,234,152 A | 8/1993 | Glaeser | |
| 5,280,139 A | 1/1994 | Suppelsa et al. | |

(Continued)

FOREIGN PATENT DOCUMENTS

| | | | |
|---|---|---|---|
| DE | 102009050426 | * | 3/2011 |
| JP | 2004165186 | | 6/2004 |

(Continued)

OTHER PUBLICATIONS

NPL: Grossi, "Self assembly of die to wafer using direct bonding methods and capillary techniques," 2007, as attached to office action in pdf format.*

(Continued)

*Primary Examiner* — Timothy Thompson
*Assistant Examiner* — Charles Pizzuto
(74) *Attorney, Agent, or Firm* — Snell & Wilmer LLP (57) ABSTRACT

Devices, methods and systems are disclosed herein to describe the wettability characteristics of the material forming a bonding area, a non-bonding area, and a melted bonding material. The melted bonding material may have a high degree of cohesion and may result in a very high contact angle (e.g., between 90°- 180°) in the non-bonding area thereby preventing or limiting the flow of a melted material into the non-bonding area, which often results when the melted bonding material forms a low contact angle (e.g., between 0°-90°) in the bonding area. In other words, by choosing a material for the non-bonding area to have low wettability characteristics when compared to the melted materials of the bonding area or by treating the material forming the non-bonding area to have much lower wettability characteristics, the melted materials of the bonding area may be prevented from flowing into the non-bonding area.

17 Claims, 7 Drawing Sheets

(56) References Cited

U.S. PATENT DOCUMENTS

| | | | |
|---|---|---|---|
| 5,289,967 A | | 3/1994 | Bampton et al. |
| 5,372,298 A | | 12/1994 | Glaeser |
| 5,381,944 A | | 1/1995 | Makowiecki et al. |
| 5,402,926 A | * | 4/1995 | Takeuchi et al. ............... 228/174 |
| 5,416,429 A | | 5/1995 | McQuade et al. |
| 5,432,998 A | | 7/1995 | Galasco et al. |
| 5,542,602 A | | 8/1996 | Gaynes et al. |
| 5,613,861 A | | 3/1997 | Smith et al. |
| 5,821,827 A | | 10/1998 | Mohwinkel et al. |
| 5,830,289 A | | 11/1998 | El-Soudani |
| 5,836,075 A | | 11/1998 | Fitzgerald et al. |
| 5,847,572 A | | 12/1998 | Iwasaki et al. |
| 5,910,341 A | * | 6/1999 | Fey et al. ...................... 427/534 |
| 5,935,430 A | | 8/1999 | Craig |
| 5,997,708 A | | 12/1999 | Craig |
| 6,098,871 A | | 8/2000 | Cairo et al. |
| 6,199,751 B1 | | 3/2001 | Gaynes et al. |
| 6,257,481 B1 | | 7/2001 | Shirzadi-Ghoshouni et al. |
| 6,303,992 B1 | | 10/2001 | Van Pham et al. |
| 6,330,164 B1 | | 12/2001 | Khandros et al. |
| 6,444,921 B1 | | 9/2002 | Wang et al. |
| 6,529,022 B2 | | 3/2003 | Pierce |
| 6,602,053 B2 | | 8/2003 | Subramanian et al. |
| 6,624,484 B2 | | 9/2003 | Christensen |
| 6,669,489 B1 | | 12/2003 | Dozier et al. |
| 6,790,684 B2 | | 9/2004 | Ahn et al. |
| 6,836,011 B2 | | 12/2004 | Azuma |
| 6,845,901 B2 | | 1/2005 | Koopmans |
| 6,864,588 B2 | | 3/2005 | Hung |
| 6,937,037 B2 | | 8/2005 | Eldridge et al. |
| 6,958,531 B2 | | 10/2005 | Ucok et al. |
| 6,975,518 B2 | | 12/2005 | Frutschy et al. |
| 6,992,520 B1 | | 1/2006 | Herbert |
| 7,002,249 B2 | | 2/2006 | Duffy et al. |
| 7,049,693 B2 | | 5/2006 | Canella |
| 7,120,999 B2 | | 10/2006 | Canella |
| 7,165,712 B2 | | 1/2007 | Abdo et al. |
| 7,245,137 B2 | | 7/2007 | Eldridge et al. |
| 7,259,625 B2 | | 8/2007 | Sanderson |
| 7,279,788 B2 | | 10/2007 | Canella |
| 7,511,521 B2 | | 3/2009 | Richmond, II et al. |
| 7,527,090 B2 | | 5/2009 | Dani et al. |
| 7,541,681 B2 | | 6/2009 | Otremba |
| 7,579,848 B2 | | 8/2009 | Bottoms et al. |
| 7,583,101 B2 | | 9/2009 | Miller |
| 7,612,456 B2 | | 11/2009 | Fujii et al. |
| 7,628,309 B1 | | 12/2009 | Eriksen et al. |
| 7,659,614 B2 | | 2/2010 | Mehrotra |
| 7,867,563 B2 | * | 1/2011 | Arase et al. ................... 427/266 |
| 8,076,696 B2 | | 12/2011 | Beaupre et al. |
| 8,168,490 B2 | | 5/2012 | Hebert |
| 2002/0092895 A1 | | 7/2002 | Blackshear et al. |
| 2002/0110008 A1 | | 8/2002 | Miyazaki et al. |
| 2003/0099097 A1 | | 5/2003 | Mok et al. |
| 2003/0173499 A1 | | 9/2003 | Cole et al. |
| 2004/0058470 A1 | | 3/2004 | Canella |
| 2004/0072456 A1 | | 4/2004 | Dozier et al. |
| 2004/0183207 A1 | | 9/2004 | Jeung et al. |
| 2004/0262742 A1 | | 12/2004 | DiStefano et al. |
| 2005/0026351 A1 | | 2/2005 | Farrar |
| 2005/0035347 A1 | | 2/2005 | Khandros et al. |
| 2005/0257877 A1 | | 11/2005 | Stark |
| 2006/0071056 A1 | | 4/2006 | Das |
| 2007/0075422 A1 | | 4/2007 | Fujii et al. |
| 2007/0144841 A1 | | 6/2007 | Chong et al. |
| 2007/0152026 A1 | | 7/2007 | Suh et al. |
| 2007/0259539 A1 | | 11/2007 | Brown et al. |
| 2007/0269997 A1 | | 11/2007 | Eldridge et al. |
| 2008/0003777 A1 | | 1/2008 | Slater et al. |
| 2008/0061808 A1 | | 3/2008 | Mok et al. |
| 2008/0073665 A1 | | 3/2008 | Slater et al. |
| 2008/0090429 A1 | | 4/2008 | Mok et al. |
| 2008/0156475 A1 | | 7/2008 | Suh |
| 2008/0157799 A1 | | 7/2008 | Gritters et al. |
| 2008/0185713 A1 | | 8/2008 | Dani et al. |
| 2008/0210971 A1 | | 9/2008 | Donofrio et al. |
| 2008/0213612 A1 | | 9/2008 | Starikov et al. |
| 2008/0253098 A1 | | 10/2008 | Liu |
| 2009/0085191 A1 | | 4/2009 | Najafi et al. |
| 2009/0142707 A1 | | 6/2009 | Eldridge et al. |
| 2009/0153165 A1 | | 6/2009 | Chong et al. |
| 2009/0242121 A1 | | 10/2009 | Suh |
| 2010/0072555 A1 | | 3/2010 | Meng et al. |
| 2010/0183896 A1 | | 7/2010 | Liu et al. |
| 2011/0009979 A1 | | 1/2011 | Shaw et al. |
| 2011/0163445 A1 | * | 7/2011 | Chakrapani et al. .......... 257/738 |
| 2011/0180777 A1 | * | 7/2011 | Afzali-Ardakani et al. ...... 257/9 |
| 2011/0240717 A1 | | 10/2011 | Song et al. |
| 2012/0112201 A1 | | 5/2012 | Otsuka et al. |

FOREIGN PATENT DOCUMENTS

| | | | | |
|---|---|---|---|---|
| JP | 2004165186 A | * | 6/2004 | ............. H01L 21/52 |
| JP | 2007189154 | | 7/2007 | |
| JP | 2007287927 | | 11/2007 | |
| JP | 2007287927 A | * | 11/2007 | |
| JP | 2010134082 | | 6/2010 | |

OTHER PUBLICATIONS

Welch, III et al.; "Transfer of Metal MEMS Packages Using a Wafer-Level Solder Transfer Technique"; IEEE Transactions on Advanced Packaging; V. 28; No. 4; pp. 643-649, Nov. 2005.

Mustain, et al.; "Transient Liquid Phase Die Attach for High-Temperature Silicon Carbide Power Devices"; IEEE Transactions on Components and Packaging Technologies; V. 33; No. 3; pp. 563-570; Sep. 2010.

Rowden, et al.; "High Temperature SiC Power Module Packaging"; Proceedings of the ASME 2009 International Mechanical Engineering Congress & Exposition IMECE2009 Nov. 13-19.

Bontemps et al.; "Low Profile Power Module Combined with State of the Art MOSFET Switches and SiC Diodes Allows High Frequency and Very Compact Three-Phase Sinusoidal Input Rectifiers" Proc. of the Conf. for Power Electronics, Intellectual Motion and Power Quality; 6 pages; 2007.

Bosco et al.; "Critical Interlayer Thickness for Transient Liquid Phase Bonding in the Cu—Sn System"; Acta Materialia 52; pp. 2965-2972; 2004.

Chen et al.; "Effect of Bonding Pressure on Transient Liquid Phase Bonding Joint Microstructure and Properties of T91/12Cr2MoWVTiB"; Advanced Materials Research; vols. 97-101; pp. 107-110; 2010.

Dodge; "Eliminating Parasitic Oscillation Between Parallel MOSFETs"; application Note APT-0402 Rev A; 6 pages, Mar. 25, 2004.

Farruggia et al.; "Hybrid Modules as an Alternative to Paralleled Discrete Devices"; International Symposium on Microelectornics; vol. 4587; 399-404, Oct. 9, 2001.

Frederikse et al.; "Thermal and Electrical Properties of Copper—tin and Nickel—tin Intermetallics"; AIP Journal of Applied Physics; vol. 72, No. 1, pp. 2879-2882; Oct. 1, 1992.

Guth et al.; "New Assembly and Interconnects Beyond Sintering Methods"; PCIM 2010; pp. 232-237; May 4-6, 2010.

Hikasa, K.; "Development of Flexible Bumped Tape Interposer"; Furukawa Review; No. 24; pp. 59-64; 2003.

Hille et al.; "Failure Mechanism and Improvement Potential of IGBT's Short Circuit Operation"; Proceedings of the 22nd International Symposium on Power Semiconductor Devices & ICs Hiroshima; pp. 33-36; 2010.

Kang et al.; "Isothermal Solidification of Cu/Sn Diffusion Couples to Form thin-Solder Joints"; Journal of Electronic Materials; vol. 31, No. 11; 2002.

MacDonald et al.; "Transient Liquid Phase Bonding Processes"; The Minerals, Metals & Materials Society; pp. 93-100; 1992.

Zheng et al.; "Partial Transient Liquid-Phase Bonding of $Si_3N_4$ with Ti/Cu/Ni Multi-Interlayers"; pp. 2026-2028; 1997.

\* cited by examiner

| MATERIAL SYSTEM | BONDING PROCESS | REMELT TEMP. |
|---|---|---|
| COPPER - TIN | 4 MIN AT 280 °C | > 415 °C |
| SILVER - TIN | 60 MIN AT 250 °C | > 600 °C |
| SILVER - INDIUM | 120 MIN AT 175 °C | > 880 °C |
| GOLD - TIN | 15 MIN AT 260 °C | > 278 °C |
| GOLD - INDIUM | 0.5 MIN AT 200 °C | > 495 °C |
| NICKEL - TIN | 6 MIN AT 300 °C | > 400 °C |

FIG. 13

BONDING AREA DESIGN FOR TRANSIENT LIQUID PHASE BONDING PROCESS

BACKGROUND

1. Field

The present invention includes methods, apparatus and systems related to the bonding area design for transient liquid phase (TLP) bonding processes. For example, the present invention improves bonding quality and fabrication reliability of bonding technologies for electronic devices.

2. Description of the Related Art

Figure 1A:
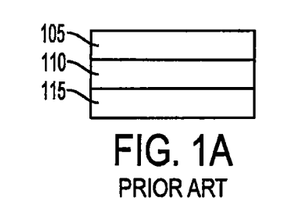
FIG. 1A illustrates an initial assembly for a TLP-bonding process.
Figure 1B:
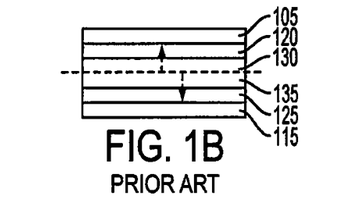
FIG. 1B illustrates a melted interlayer diffusion during the TLP-bonding process.
Figure 1C:
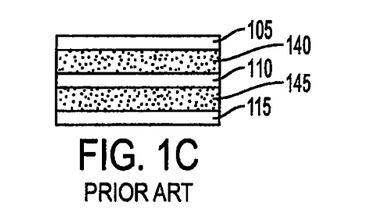
FIG. 1C illustrates an isothermal solidification process forming the alloys during the TLP-bonding process.

TLP bonding is a known process for bonding together various materials and devices. Such a process has been used in the manufacturing of electronic devices incorporating power electronics, MEMS sensors, SiC devices, SAW sensors, LEDs, and the like. For example, TLP may be used to bond a wafer to another wafer (e.g., wafer-to-wafer bonding) or to bond a die to a substrate (e.g., die-to-substrate bonding). FIG. 1A-FIG. 1D illustrate a traditional four-step process for TLP bonding. Initially, as shown in FIG. 1A, a first material 105 may be bonded to a second material 115 (which may be the same or different material as the first material 105) via a third material 110. FIG. 1B illustrates what happens when heat is applied to the third material 110. In practice, the third material 110 has a melting point that is substantially lower than the first material 105 and the second material 115, and as such, the third material 110 will melt before the first material 105 and the second material 115 melt. As the third material 110 melts, it diffuses into the first material 105 and the second material 115 such that layers 120 and 125 may become a physical blend of the materials 105 and 110, and materials 115 and 110, respectively, whereas layers 130 and 135 may remain predominantly the third material 110. As the diffused materials continue to sequentially react, FIG. 1C illustrates resulting alloys 140 and 145 which are formed via isothermal solidification. The solidification continues until the bondline becomes homogenous as a mixture of materials 105, 110 and 115 shown as bondline alloy 150 in FIG. 1D. In this manner, the third material 110 bonds together the first material 105 and the second material 115. Although not shown, large mechanical pressure or air pressure control may also be applied during the TLP bonding process.

Figure 1D:
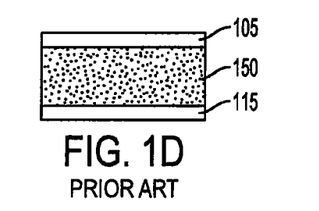
FIG. 1D illustrates the homogenization of the formed alloy for the TLP-bonding process.

Because the bondline alloy 150 provides excellent electrical and thermal conductivity, among other advantages, much effort has been focused on uniform bonding and improving the bondline. As such, there has been little advancement made to address the problematic expansion of melted material beyond the bonding area.

Figure 2:
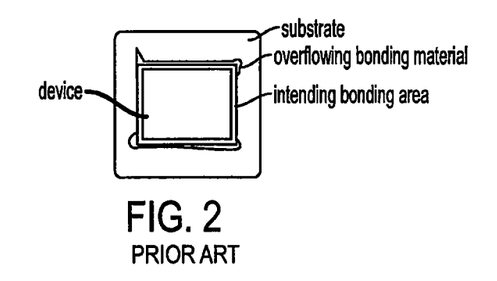
FIG. 2 illustrates an overflow problem with respect to a die TLP-bonded to a substrate.
Figure 3:
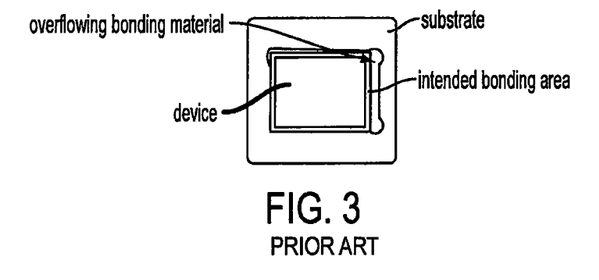
FIG. 3 illustrates an overflow problem with respect to a die TLP-bonded to a substrate.

This pervading and unavoidable problem with standard TLP bonding is illustrated by FIG. 2 and FIG. 3 where the melted materials (or interlayer) have expanded or moved out of the bonding area due to poor or non-existent expansion limiters. As shown in FIG. 2, the melted materials expand beyond the limits of the entire boundary on all four sides. While not shown, the melted material exceeding the boundary might also be thick enough to unintentionally contact another device further causing problems. Even where the melted material does not exceed the boundary on all four sides as shown in FIG. 3, or become thick enough in the overflow area, unfortunately, such an occurrence may still cause significant damage to the devices to be bonded as well as other production problems. Generally, the flowing or reflowing of the metal to unintended portions of an electrical device may cause an electrical short circuit. Furthermore, because the flowing of the metal is often unpredictable and uncontrolled, an inconsistent or non-uniform product may result. Additional bonding material (e.g., the third material 110) may also be needed to account for losses due to the undesired migration of the metal beyond the bonding area. Furthermore, the problem does not necessarily end at the time of production, but may occur or re-occur if, at the time the device is utilized, heat is produced that again melts the reflowed material.

Accordingly, what is needed is a flow or reflow control to mitigate the unintended movement of the bonding material.

SUMMARY

Apparatus, systems and/or methods directed to addressing the issue of bonding material overflow are described herein. More particularly, one or more embodiments described herein may limit the expansion of melted materials while still maintaining good bonding quality to ensure device performance. For example, by differentiating the wettability of the bonding area as compared to the non-bonding area, the expansion of the melted materials may be limited to the bonding area.

The embodiments of the present invention described herein may provide one or more advantages including but not limited to: (1) ensuring excellent contact between the devices to be bonded while maintaining both electrical and thermal conductivity properties to the bonded devices; (2) allowing automatic alignment between the device and the bonding area; (3) diminishing the dependency on fabrication conditions to ensure reliable and consistent results which is critical for mass production; and (4) enabling greater flexibility and application to a plurality of different materials, different bonding types (e.g., wafer-to-wafer, die-to-wafer, die-to-substrate, and/or die-to-die), and different types of fabrication processes including conventional fabrication techniques.

One or more of these advantages may be achieved by configuring the wettability characteristics of the material forming the non-bonding layer or area (e.g., by lowering the wettability). As more fully discussed infra, the melted material (e.g., bonding material) selected may have a high degree of cohesion with itself and may result in a very high contact angle (e.g., between 90°-180°) with the surface of the non-bonding layer or area, which tends to resist the flow of the melted material into the non-bonding area otherwise occurring when the melted material forms a low contact angle (e.g., between 0°-90°). In other words, by selecting a material for the non-bonding areas that has lower wettability characteristics or can be treated to have lower wettability characteristics than those of the melted materials of the bonding areas, the melted materials of the bonding areas might not overflow into the non-bonding areas.

In one embodiment, the present invention may be an apparatus for limiting the expansion of melted material during a transient liquid phase (TLP) bonding process, the apparatus comprising: a bonding area formed of a material having a first wettability characteristic for contacting a melted metal serving as the bonding material; and a non-bonding area forming a perimeter about the bonding area, the non-bonding area formed of a material having a lower wettability characteristic than the bonding area material which limits the melted metal from flowing into the non-bonding area.

In one embodiment, the present invention may be a method for manufacturing a substrate to be transient liquid phase (TLP) bonded to a die, the method comprising: forming a bonding area on a surface of the substrate using a first material having a first wettability; and forming a non-bonding area surrounding the bonding area on the surface of the substrate using a second material having a second wettability lower than the first wettability configured to limit a melted material located at the bonding area from flowing into the non-bonding area.

In one embodiment, the present invention may be an assembly for transient liquid phase (TLP) bonding a substrate to a die, the assembly comprising: a die having a bonding material on a surface to be bonded; and a substrate for bonding to the bonding material of the die, the substrate including: a first substrate metal layer, an insulation layer positioned on the first substrate metal layer, a second substrate metal layer positioned on top of the insulation layer, a bonding area positioned on the second substrate metal layer for contacting the bonding material of the die during a TLP bonding process, the bonding area formed of a first material, and a non-bonding area positioned on the second substrate metal layer and surrounding the bonding area, the non-bonding area formed of a second material having lower wettability characteristics than the first material of the bonding area which limits the bonding material from flowing into the non-bonding area when the bonding material is melted during a TLP bonding process.

Devices, methods and systems are disclosed herein to describe the wettability characteristics of the material forming a bonding area, a non-bonding area, and a melted bonding material. The melted bonding material may have a high degree of cohesion and may result in a very high contact angle (e.g., between 90°-180°) in the non-bonding area thereby preventing or limiting the flow of a melted material into the non-bonding area, which often results when the melted bonding material forms a low contact angle (e.g., between 0°-90°) in the bonding area. In other words, by choosing a material for the non-bonding area to have low wettability characteristics when compared to the melted materials of the bonding area or by treating the material forming the non-bonding area to have much lower wettability characteristics, the melted materials of the bonding area may be prevented from flowing into the non-bonding area. Alternatively, the material forming the bonding area may be treated and its wettability altered to produce similar results.

BRIEF DESCRIPTION OF THE DRAWINGS

The features, obstacles, and advantages of the present invention will become more apparent from the detailed description set forth below when taken in conjunction with the drawings, wherein.

DETAILED DESCRIPTION

Apparatus, systems and/or methods that implement the embodiments of the various features of the present invention will now be described with reference to the drawings. The drawings and the associated descriptions are provided to illustrate some embodiments of the present invention and not to limit the scope of the present invention. Throughout the drawings, reference numbers are re-used to indicate correspondence between referenced elements.

Figure 4A:
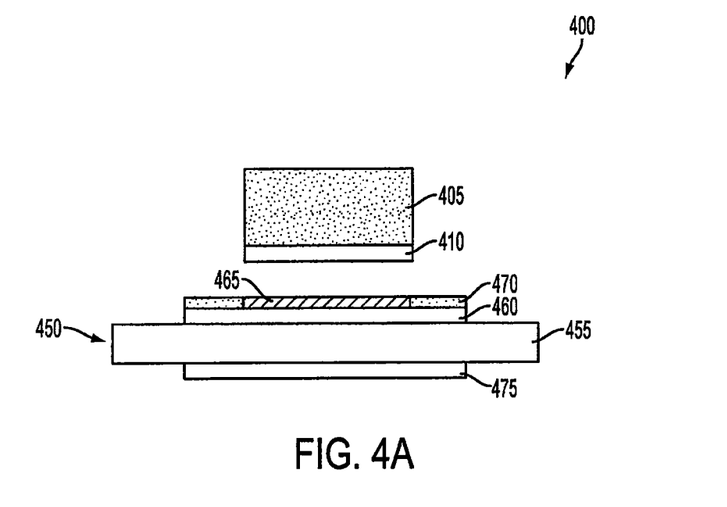
FIG. 4A illustrates a substrate having a bonding area and a non-bonding area with respect to a TLP-bonding process in accordance with an embodiment of the present invention.

The present invention relates to apparatus, systems or methods directed to limiting the expansion of melted materials while still maintaining good bonding quality, thereby ensuring device performance. FIG. 4A illustrates a die-to-substrate bonding assembly 400 including a device 405, which is to be TLP-bonded to a substrate 450. In this particular example, the device 405 may include a layer of bonding material 410 which may be, for instance, indium or tin. The substrate 450 may include a first substrate metal layer 460 and a second substrate metal layer 475 sandwiching an insulation layer 455. On top of the first substrate metal layer 460 (or contact metal) may sit a bonding layer 465 and a non-bonding layer 470 (e.g., sequentially deposited via evaporation, sputtering, electroplating, spill and modeling, direct bonding of materials and the like). The depositing sequence may also be varied depending on fabrication requirements. In this example, the material used to construct the bonding layer 465 may be the same material used to construct the bonding material 410, while being different from the material used to construct the non-bonding layer 470. While shown to be of the same thickness, the bonding layer 470 and the non-bonding layer 465 may be of different thicknesses.

Figure 4B:
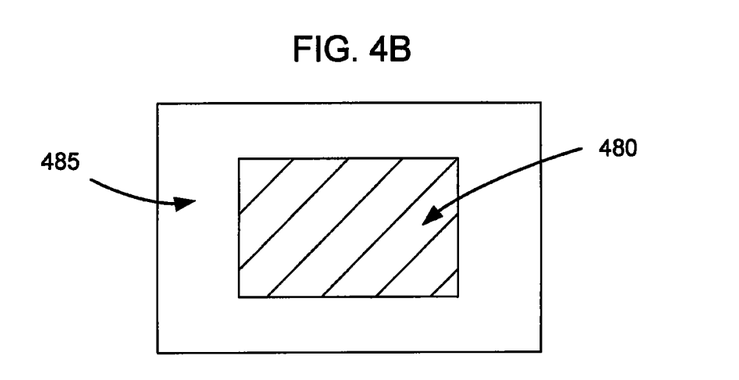
FIG. 4B illustrates a two-dimensional view of the bonding area in relationship to the non-bonding area of FIG. 4A in accordance with an embodiment of the present invention.
Figure 13:
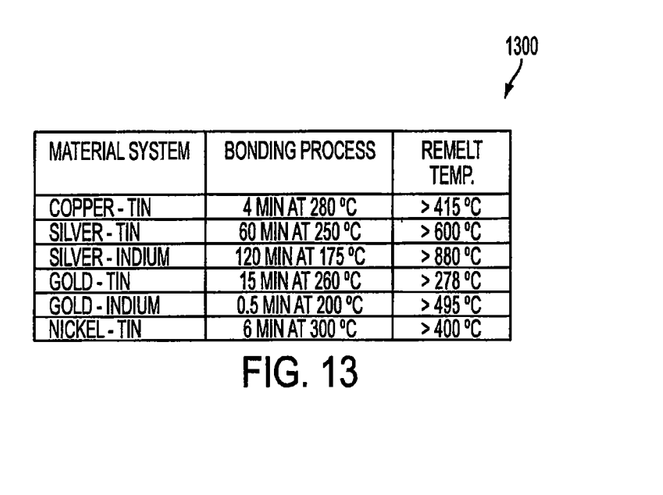
FIG. 13 is a table of examples of TLP-bonding materials, process and re-melting temperatures.

As shown in FIG. 4B, the bonding layer 465 may correspond to the bonding area 480, while the non-bonding layer 470 may correspond to the non-bonding area 485. When the bonding material 410 and the bonding layer 465 are brought into contact and heated to induce diffusion and solidification via the TLP process, the resulting melted material forming the bond between the device 405 and the substrate 450 is limited and might not expand into the non-bonding area 485. More particularly, this may be achieved by taking advantage of the wettability characteristics of the material used as the non-bonding layer 470. The melted material (e.g., the bonding material 410 and/or the material of the bonding area 465) may have a high degree of cohesion and may result in a very high contact angle (e.g., between 90-180°) with the surface of the non-bonding layer 470, thereby resisting the tendency to flow into the non-bonding area 485, which would otherwise likely occur if the melted material formed a low contact angle (e.g., between 0°-90°) with the surface of the non-bonding layer 470. By choosing a material for the non-bonding area 485 and/or the bonding material 410 that has low wettability characteristics when compared to the melted material, the melted material may be, in one sense, repelled by the material of the non-bonding area 485, and thus prevented from spilling out of the bonding area 480 into the non-bonding area 485. As an example, the non-bonding area 485 may be constructed out of cadmium sulfide (CdS) by way of microwave-assisted chemical bath deposition. The bonding area 480 may be constructed out of copper or other material, as shown in the table of FIG. 13.

Figure 4C:
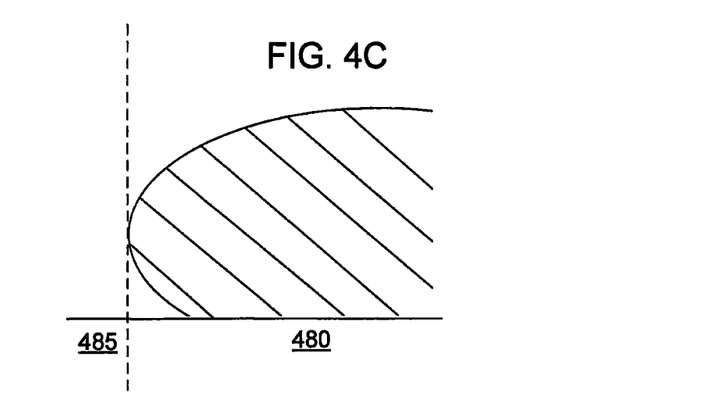
FIG. 4C illustrates a melted bonding material exhibiting low wetting with respect to the non-bonding area in accordance with an embodiment of the present invention.
Figure 4D:
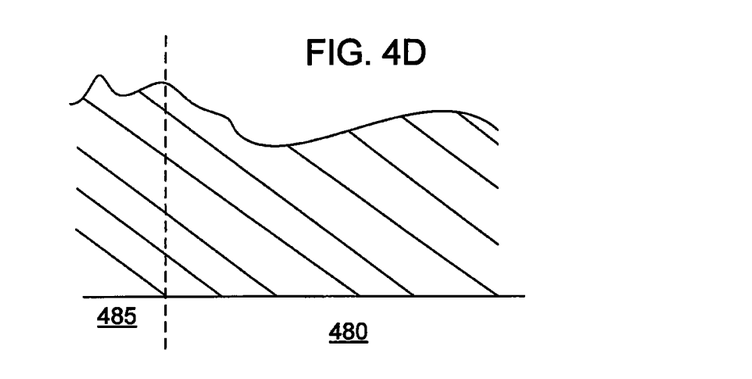
FIG. 4D illustrates a melted bonding material exhibiting high wetting with respect to the non-bonding area resulting in overflowing in accordance with an embodiment of the present invention.

FIG. 4C illustrates how the melted material may behave against a low wettability non-bonding area 485 and a high wettability bonding area 480, while FIG. 4D conversely illustrates how the melted material may behave against a high wettability non-bonding area 485, here shown to spill over into the bonding area 485.

In addition and/or alternatively, the material of the bonding layer 465 may be selected to have high wettability such that it more easily and/or more strongly bonds with the bonding material 410. The increased adhesiveness between the bonding layer 465 and the bonding material 410 further helps to confine the melted material to the bonding area 480.

For clarity, the device and the bonding material on the device (e.g., shown as device 405 and bonding material 410 in FIG. 4) has been omitted with respect to FIGS. 5A-5C, 6A-6C, 7A-7C, 8A-8C, 9A-9C and 10A-10C.

Figure 5A:
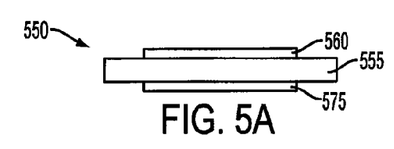
FIG. 5A illustrates a substrate having a contact metal for TLP-bonding in accordance with an embodiment of the present invention.
Figure 5B:
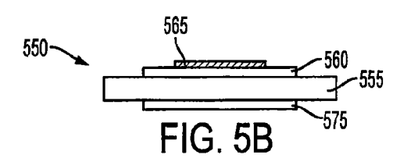
FIG. 5B illustrates the substrate of 5A having a contact metal with a first material deposited thereon serving as the bonding area in accordance with an embodiment of the present invention.
Figure 5C:
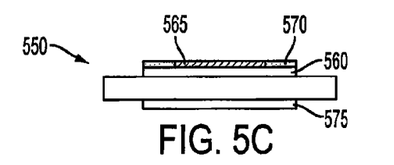
FIG. 5C illustrates the substrate of 5B with a deposited second material serving as the non-bonding area in accordance with an embodiment of the present invention.

FIGS. 5A-5C illustrate one embodiment of the present invention and more particularly, illustrate a manufacturing process of a substrate assembly 550 in preparation for TLP bonding with a device (e.g., a die). As shown in FIG. 5A, a substrate assembly 550 may include an insulation layer 555 positioned between a first substrate metal 560 and a second substrate metal 575. Next, as shown in FIG. 5B, a material forming a bonding area 565 may be deposited on top of the first substrate metal 560 via evaporation, sputtering, electroplating, spill and modeling, direct bonding of materials and the like. However, as shown, a portion about the perimeter of the first substrate metal 560 may be preserved for depositing a second material to form a non-bonding area 570 on top of the first substrate metal 560, as shown by FIG. 5C. As discussed above with respect to FIG. 4C-FIG. 4D, the material used to form the non-bonding area 570 may have low wettability characteristics to limit the migration of the melted materials into the non-bonding area 570 during the TLP process.

Figure 6A:
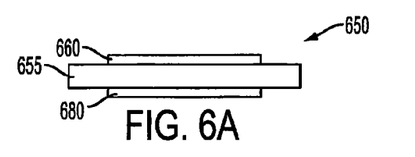
FIG. 6A illustrates a substrate having a contact metal for TLP-bonding in accordance with an embodiment of the present invention.
Figure 6B:
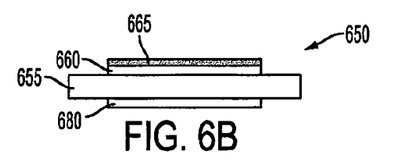
FIG. 6B illustrates the substrate of 6A having a contact metal with a first material deposited thereon serving as the bonding and non-bonding area in accordance with an embodiment of the present invention.
Figure 6C:
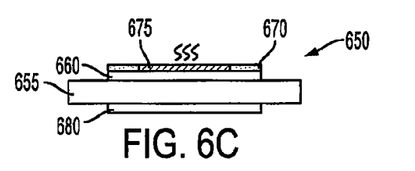
FIG. 6C illustrates the substrate of 6B with a portion of the deposited material treated to change the material property enabling it to serve as the bonding area in accordance with an embodiment of the present invention.

FIGS. 6A-6C illustrate another embodiment of the present invention. One difference between the embodiment of FIGS. 6A-6C and the embodiment of FIGS. 5A-5C is that only one material is used to form the bonding area and non-bonding areas.

More particularly, FIGS. 6A-6C illustrate a manufacturing process of a substrate assembly 650 in preparation for TLP bonding with a device (e.g., a die). As shown in FIG. 6A, a substrate assembly 650 may include an insulation layer 655 positioned between a first substrate metal 660 and a second substrate metal 680. Next, as shown in FIG. 6B, a layer of material 665 may be deposited on top of the first substrate metal 660 via evaporation, sputtering, electroplating, spill and modeling, direct bonding of materials and the like. As shown in FIG. 6C, an interior portion of the material 665 may undergo treatment to change its characteristics and may serve as a bonding area 675. The non-treated portions surrounding the bonding area 675 may then serve as a non-bonding area 670.

One example of a treatment method is plasma exposure. The material forming the bonding area 675 and the non-bonding area 670 may have hydrophobic characteristics. By employing plasma exposure, the portion of the material to serve as the bonding area 675 may be changed from a hydrophobic material into a hydrophilic material to control the wettability of the bonding area 675. When the melted bonding material is introduced, the melted bonding material (e.g., liquefied form of the bonding material) may be drawn to the hydrophilic material in the bonding area 675 and may be repelled by the surrounding hydrophobic material in the non-bonding area 670, thereby resulting in the melted bonding material remaining confined or limited within the bonding area 675. The wettability of the material to serve as the bonding area 675 may additionally or alternatively be controlled by changing a texture or roughness of the surface to differentiate the bonding area 675 from the non-bonding area 670. Other techniques may also be employed to differentiate the wettability of the materials in the bonding area 675 and/or the non-bonding area 670 with the aim of confining the melted material within the bonding area 675 (e.g., controlling the non-bonding area 670 to exhibit a very low wettability or controlling the bonding area 675 to exhibit a very high wettability).

Figure 7A:
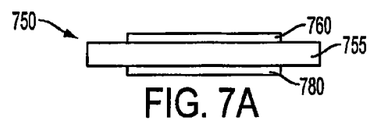
FIG. 7A illustrates a substrate having a contact metal for TLP-bonding in accordance with an embodiment of the present invention.
Figure 7B:
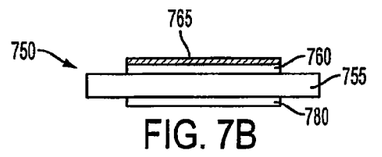
FIG. 7B illustrates the substrate of 7A having a contact metal with a first material deposited thereon serving as the bonding and non-bonding area in accordance with an embodiment of the present invention.
Figure 7C:
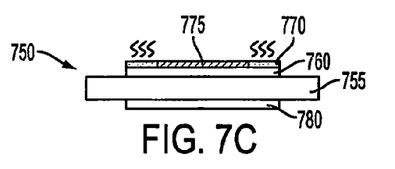
FIG. 7C illustrates the substrate of 7B with a portion of the deposited material treated to change the material property enabling it to serve as the non-bonding area in accordance with an embodiment of the present invention.

FIGS. 7A-7C illustrate another embodiment of the present invention. One difference between the embodiment of FIGS. 7A-7C and the embodiment of FIGS. 6A-6C is that the non-bonding area is treated while leaving the bonding area untreated as further discussed below.

More particularly, FIGS. 7A-7C illustrate a manufacturing process of a substrate assembly 750 in preparation for TLP bonding with a device (e.g., a die). As shown in FIG. 7A, a substrate assembly 750 may include an insulation layer 755 positioned between a first substrate metal 760 and a second substrate metal 780. Next, as shown in FIG. 7B, a layer of material 765 may be deposited on top of the first substrate metal 760 via evaporation, sputtering, electroplating, spill and modeling, direct bonding of materials and the like. Unlike in FIG. 6C, where an inner portion of the layer of material 665 was treated, in FIG. 7, the portion that is treated is that forming a perimeter of the layer of material 765. The treated perimeter portion may serve as a non-bonding area 770, leaving the non-treated portion within the non-bonding area 770 as a bonding area 775.

The various treatment methods used to alter the characteristics of the material in the bonding area 675 of FIG. 6C may similarly be applied to the non-bonding area 770 of FIG. 7C. For example, by employing plasma exposure, the portion of the material to serve as the non-bonding area 770 may be changed from a hydrophilic material into a hydrophobic material, while leaving the hydrophilic characteristic of the bonding area 775 unaltered. Other treatment techniques may be employed to differentiate the wettability of the material serving as the non-bonding area 770 from the material serving as the bonding area 775 with the aim of containing the melted material within the bonding area 775.

As applicable to any of the embodiments described herein, further treatment techniques may include the formation of a fine grid (e.g., <1 micrometer by employing laser ablation) on a surface of the non-bonding areas (e.g., the non-bonding area 770) to lower the wettability of the non-bonding surface (and hence, produce a more hydrophobic material).

Figure 8A:
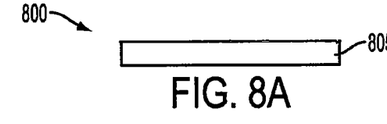
FIG. 8A illustrates a substrate for TLP-bonding in accordance with an embodiment of the present invention.
Figure 8B:
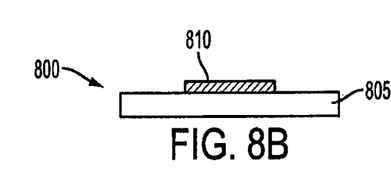
FIG. 8B illustrates the substrate of 8A having a first material deposited thereon serving as the bonding area in accordance with an embodiment of the present invention.
Figure 8C:
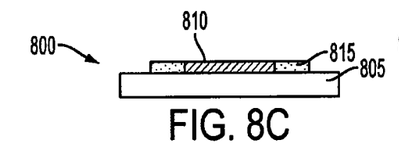
FIG. 8C illustrates the substrate of 8B with a deposited second material serving as the non-bonding area in accordance with an embodiment of the present invention.

FIGS. 8A-8C illustrate one embodiment of the present invention. This embodiment may differ from the embodiments of FIGS. 5A-5C, 6A-6C and 7A-7C at least because an initial substrate assembly 800 does not include a first substrate metal layer (e.g., first substrate metal layer 560) or a second substrate metal layer (e.g., second substrate metal layer 575). Instead, the materials deposited on the initial substrate assembly 800 (e.g., used to define the bonding/non-bonding areas) are further used as a substrate metal layer.

For example, as shown in FIG. 8A, the substrate assembly 800 may initially include an insulation layer 805 without any contacting substrate metal layers. Next, as shown in FIG. 8B, a material forming the bonding area 810 may be deposited on top of the insulation layer 805 via evaporation, sputtering, electroplating, spill and modeling, direct bonding of materials and the like. However, the material forming the bonding area 810 might not expand out to the perimeter of the insulation layer 805, thus preserving a portion for depositing of a second material in a non-bonding area 815 also on top of the insulation layer 805 as shown by FIG. 8C. In this manner, the two materials deposited on the insulation layer 805 constitute the contact layer for the substrate assembly 800. Further, the material used to form the non-bonding area 815 may have low wettability characteristics to prevent the melted materials from expanding into the non-bonding area 815 during the TLP process.

Figure 9A:
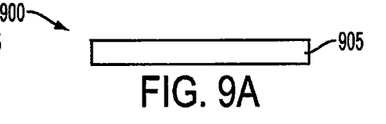
FIG. 9A illustrates a substrate for TLP-bonding in accordance with an embodiment of the present invention.
Figure 9B:
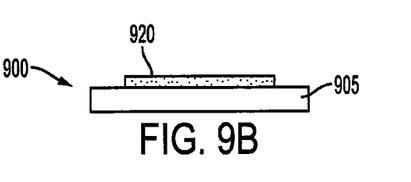
FIG. 9B illustrates the substrate of 9A having a first material deposited thereon serving as the bonding and non-bonding area in accordance with an embodiment of the present invention.
Figure 9C:
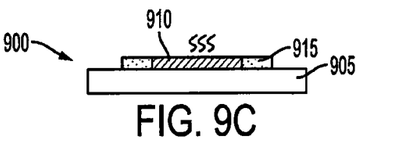
FIG. 9C illustrates the substrate of 9B with a portion of the deposited material treated to change the material property enabling it to serve as the bonding area in accordance with an embodiment of the present invention.

FIGS. 9A-9C illustrate another embodiment of the present invention. One difference between the embodiment of FIGS. 9A-9C and the embodiment of FIGS. 8A-8C is that only one material is used to form the bonding area and the non-bonding areas as further discussed below.

More particularly, FIGS. 9A-9C illustrate a manufacturing process of a substrate assembly 900. As shown in FIG. 9A, a substrate assembly 900 may include an insulation layer 905 without a first substrate metal and a second substrate metal. Next, as shown in FIG. 9B, a layer of material 920 may be deposited on top of the insulation layer 905 via evaporation, sputtering, electroplating, spill and modeling, direct bonding of materials and the like, and may constitute the contact layer for the substrate assembly 900. Similar to FIG. 6C, the properties of an interior portion of the layer of material 920 in FIG. 9C may be changed such that the interior portion may serve as a bonding area 910, leaving the non-treated portions surrounding the bonding area 910 as a non-bonding area 915.

The various treatment methods used to alter the characteristics of the material in the bonding area 675 of FIG. 6C may similarly be employed to the bonding area 910 of FIG. 9C, with the aim of differentiating the wettability of the material in the bonding area 910 from that of the material in the non-bonding area 915.

Figure 10A:
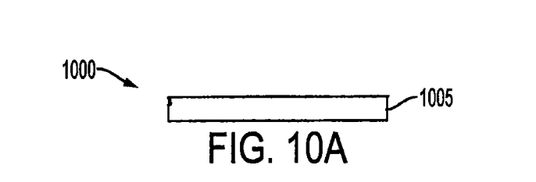
FIG. 10A illustrates a substrate for TLP-bonding in accordance with an embodiment of the present invention.
Figure 10B:
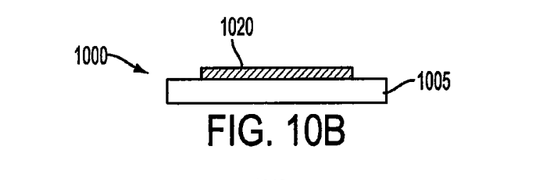
FIG. 10B illustrates the substrate of 10A having a first material deposited thereon serving as the bonding and non-bonding area in accordance with an embodiment of the present invention.
Figure 10C:
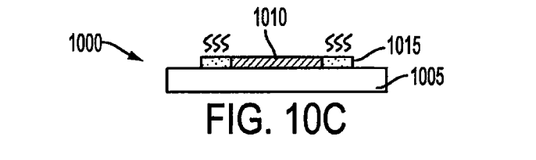
FIG. 10C illustrates the substrate of 10B with a portion of the deposited material treated to change the material property enabling it to serve as the non-bonding area in accordance with an embodiment of the present invention.

FIGS. 10A-10C illustrate another embodiment of the present invention. One difference between the embodiment of FIGS. 10A-10C and the embodiment of FIGS. 9A-9C is that the non-bonding area is treated while leaving the bonding area untreated as further discussed below.

As shown in FIG. 10A, a substrate assembly 1000 may include an insulation layer 1005 without a first substrate metal and a second substrate metal. Next, as shown in FIG. 10B, a layer of material 1020 may be deposited on top of the insulation layer 1005 via evaporation, sputtering, electroplating, spill and modeling, direct bonding of materials and the like, and may constitute the contact layer for the substrate assembly 1000. Similar to FIG. 7C, the properties of a perimeter portion of the layer of material 1020 in FIG. 10C may be changed such that the treated portion may serve as a non-bonding area 1015, leaving the non-treated portion within the non-bonding area 1015 as a bonding area 1010.

Again, the various treatment methods used to alter the characteristics of the material in the non-bonding area 770 of FIG. 7C may similarly be applied to the non-bonding area 1015 of FIG. 10C, with the aim of differentiating the wettability of the material in the non-bonding area 1015 from that of the material in the bonding area 1010.

Figure 11:
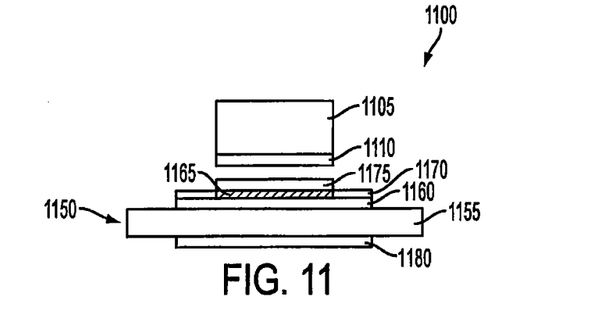
FIG. 11 illustrates a TLP-bonding assembly with bonding materials on both the device to be bonded and the substrate (stacked) in accordance with an embodiment of the present invention.
Figure 12:
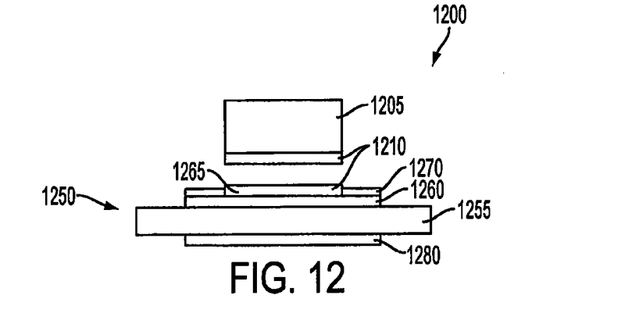
FIG. 12 illustrates a TLP-bonding assembly with bonding materials on both the device to be bonded and the substrate (unstacked) in accordance with an embodiment of the present invention.

FIGS. 11 and 12 illustrate different embodiments of the location of the bonding materials as compared to, for example, FIGS. 4-10 which have the bonding material on the device side, and the bonding area on the substrate side. As shown in FIG. 11, an assembly set up 1100 may include a device 1105 having a bonding material 1110 located on a side of the device 1105 for attachment to a substrate 1150. The substrate 1150 may include a insulation layer 1155 having a first substrate metal 1160 on one side and a second substrate material 1180 on another side. A first material and a second material for forming a bonding area 1165 and a non-bonding area 1170, respectively, may be deposited on the first substrate material 1180. Also shown is the bonding material 1175, which is deposited on top of the material forming the bonding area 1165. Upon heating, the bonding material 1110 and 1175 react with one another and directly bond the device 1105 and the substrate 1150 together. It should be noted that the material for bonding material 1175 and the material forming the bonding area 1165 may be the same or different material. This embodiment illustrates that the bonding material may be located on both the device side and the substrate side, with some of the bonding material initially located directly on the bonding area 1170. The principles discussed above with respect to the difference in wettability and how to limit the melted bonding material to the bonding area 1165 are further applicable in this embodiment.

FIG. 12 illustrates another example of how the bonding material may be located on both the device 1205 and the substrate 1250. One difference between the embodiment of FIG. 12 and the embodiment of FIG. 11 is that the material forming the bonding area 1265 and the substrate-side bonding material is the same material.

As shown in FIG. 12, an assembly set up 1200 may include a device 1205 having a bonding material 1210 located on a side of the device 1205 for attaching to a substrate 1250. The substrate 1250 may include an insulation layer 1255 having a first substrate metal 1260 on one side and a second substrate material 1280 on another side. A first material and a second material for forming a bonding area 1265 and a non-bonding area 1270, respectively, may be deposited on the first substrate material 1260. Here, unlike the assembly 1100 of FIG. 11, the first material forming the bonding area 1265 may also constitute the bonding material located on the substrate side.

Upon heating, the bonding material 1210 and 1265 may react with one another and directly bond the device 1205 to the substrate 1250. The principles discussed above with respect to the difference in wettability and how to limit the melted bonding material to the bonding area 1265 are further applicable in this embodiment.

Additional variations on the embodiments described herein (e.g., with respect to FIGS. 11 and 12) may include stacking different materials to form the bonding material and/or having different materials serving as the bonding material on the device side and the bonding material on the substrate side. In addition or as an alternative, the bonding materials on the device side and/or the bonding side may be treated (e.g., plasma treated, changing of the surface texture, etc.) to enhance the ability of the non-bonding areas to limit the melted bonding materials to the bonding area.

While not illustrated, one of ordinary skill in this field will understand that the bonding material may be located solely on the substrate side, and upon performance of the TLP-bonding process, may cause the substrate to be bonded to a device (e.g., a die).

While many of the embodiments herein have been described with respect to a die-to-substrate TLP-bonding process for clarity and ease of comparison, the principles described are equally applicable to bonding of other types of structures such as die-to-die, die-to-wafer, and/or wafer-to-wafer, among others.

The structure of various embodiments, methods of manufacturing the same and the principles providing the advantages of such embodiments having been discussed, attention will now be turned to the specific materials that may be used.

FIG. 13 illustrates a table 1300 of examples of TLP-bonding materials, process and remelting temperatures. As shown, the material system may include a pair of materials that may be used for the bonding area and the bonding material. For example, "Copper-Tin" may both be bonding materials and may be used as the bonding area material. While many examples are given, the list is not exhaustive in number or type of materials usable. The next column lists details of the TLP-bonding process for the particular material combination. For example, with respect to "Copper-Tin," homogenization may be complete after 4 minutes of heating at 280° Celsius. The last column details a temperature needed to re-melt the formed alloy. For example, with respect to "Copper-Tin," a temperature of at least at 415° Celsius is likely needed to re-melt the formed alloy into a liquid.

The embodiments of the present invention described herein may provide one or more advantages including but not limited to ensuring excellent contact between the devices to be bonded while maintaining both electrical and thermal conductivity properties to the bonded devices, allowing automatic alignment between the device and the bonding area, requiring less dependency on fabrication conditions to ensure reliable and consistent results which is critical for mass production, and flexibility for application to a plurality of different materials, plurality of different bonding types (e.g., wafer-to-wafer, die-to-wafer, die-to-substrate, and/or die-to-die), plurality of different types of fabrication processes including conventional fabrication techniques.

Skilled artisans may implement the described functionality in varying ways for each particular application, but such implementation decisions should not be interpreted as causing a departure from the scope of the disclosed apparatus and/or methods.

The previous description of the disclosed examples is provided to enable any person of ordinary skill in the art to make or use the disclosed methods and apparatus. Various modifications to these examples will be readily apparent to those skilled in the art, and the principles defined herein may be applied to other examples without departing from the spirit or scope of the disclosed method and apparatus. The described embodiments are to be considered in all respects only as illustrative and not restrictive and the scope of the invention is, therefore, indicated by the appended claims rather than by the foregoing description. All changes which come within the meaning and range of equivalency of the claims are to be embraced within their scope.

What is claimed is:

1. An apparatus formed as a result of a transient liquid phase (TLP) bonding process, the apparatus comprising:
    a homogenous bondline alloy formed of a first bonding material, a second bonding material, and a melted bonding layer formed of a material having a first wettability characteristic; and
    a non-bonding layer forming a perimeter about the bonding layer, the non-bonding layer formed of a material having a lower wettability characteristic than the material of the melted bonding layer, the non-bonding layer limiting the melted bonding layer from flowing into the non-bonding layer.

2. The apparatus of claim 1, wherein the material forming the melted bonding layer and the material forming the non-bonding layer are different materials.

3. The apparatus of claim 1, wherein the material forming the melted bonding layer and the material forming the non-bonding layer are the same materials, further wherein the material forming the melted bonding layer is treated to increase its wettability characteristic by changing the its hydrophobic surface to a hydrophilic surface.

4. The apparatus of claim 1, wherein the material forming the melted bonding layer and the material forming the non-bonding layer are the same materials, further wherein the material forming the non-bonding layer is treated to decrease its wettability characteristic by changing its hydrophilic surface to a hydrophobic surface.

5. The apparatus of claim 1, wherein the material forming the melted bonding layer and the material forming the non-bonding layer are the same materials, further wherein a surface where the melted bonding layer contacts the non-bonding layer is treated to increase its wettability characteristic by increasing the smoothness of the surface.

6. The apparatus of claim 1, wherein the material forming the melted bonding layer and the material forming the non-bonding layer are the same materials, further wherein a surface of the non-bonding layer where the melted bonding layer contacts the non-bonding layer is treated to decrease its wettability characteristic by increasing the roughness of the surface.

7. The apparatus of claim 1, wherein the apparatus is a substrate to be bonded to a die, the apparatus further comprising a substrate layer on which is formed the melted bonding layer and the non-bonding layer, the melted bonding layer bonding the substrate to the die.

8. The apparatus of claim 1, wherein the apparatus is a die to be bonded to the substrate, the apparatus further comprising a layer on which is formed the melted bonding layer and the non-bonding layer, the bonding layer bonding the substrate to the die.

9. The apparatus of claim 1, wherein the apparatus is a first wafer to be bonded to a second wafer, the apparatus further comprising a layer on which is formed the melted bonding layer and the non-bonding layer, the melted bonding layer bonding the first wafer to the second wafer.

10. The apparatus of claim 1, wherein the apparatus is a first die to be bonded to a second die, the apparatus further comprising a layer on which is formed the melted bonding layer and the non-bonding layer, the melted bonding layer bonding the first die to the second die.

11. The apparatus of claim 1, wherein the apparatus is a die to be bonded to a wafer, the apparatus further comprising a layer on which is formed the melted bonding layer and the non-bonding layer, the melted bonding layer bonding the die to the wafer.

12. An assembly formed as a result of transient liquid phase (TLP) bonding of a substrate to a die, the assembly comprising:

a die having a bottom surface attached to a TLP bonding material;
a substrate including:
a second substrate metal layer,
an insulation layer positioned on the second substrate metal layer, and
a first substrate metal layer positioned on the insulation layer;
a bonding layer positioned on the first substrate metal layer the bonding layer formed of a first material;
a homogeneous bondline alloy formed of the first substrate metal layer, the TLP bonding material of the die, and a melted bonding layer between the first substrate metal layer and the TLP bonding material of the die; and
a non-bonding layer positioned on the first substrate metal layer and surrounding the homogeneous bondline alloy, the non-bonding layer formed of a second material having lower wettability characteristics than the homogeneous bondline alloy, the non-bonding layer limiting the melted bonding layer from flowing into the non-bonding layer during a TLP bonding process.

13. The assembly of claim 12, wherein the material forming the melted bonding layer and the material forming the non-bonding layer are different materials.

14. The assembly of claim 12, wherein the material forming the melted bonding layer and the material forming the non-bonding layer are the same materials, further wherein the material forming the melted bonding layer is treated to increase its wettability characteristic by changing the its hydrophobic surface to a hydrophilic surface.

15. The assembly of claim 12, wherein the material forming the melted bonding layer and the material forming the non-bonding layer are the same materials, further wherein the material forming the non-bonding layer is treated to decrease its wettability characteristic by changing its hydrophilic surface to a hydrophobic surface.

16. The assembly of claim 12, wherein the material forming the melted bonding layer and the material forming the non-bonding layer are the same materials, further wherein a surface where the melted bonding layer contacts the non-bonding layer is treated to increase its wettability characteristic by increasing the smoothness of the surface.

17. The assembly of claim 12, wherein the material forming the non-bonding layer and the material forming the non-bonding layer are the same materials, further wherein a surface of the non-bonding layer where the melted bonding layer contacts the non-bonding layer is treated to decrease its wettability characteristic by increasing the roughness of the surface.

* * * * *